United States Patent [19]

Johnson et al.

[11] 4,446,443

[45] May 1, 1984

[54] AMPLIFIER HAVING REDUCED POWER DISSIPATION AND IMPROVED SLEW RATE

[75] Inventors: Fred D. Johnson, Evanston; Michael D. Flasza, Schaumburg; George J. Tzakis, Glenview, all of Ill.

[73] Assignee: Zenith Radio Corporation, Glenview, Ill.

[21] Appl. No.: 379,838

[22] Filed: May 20, 1982

Related U.S. Application Data

[63] Continuation-in-part of Ser. No. 232,783, Feb. 9, 1981, abandoned.

[51] Int. Cl.³ .......................... H03F 3/45; H03F 3/26; H04N 5/44
[52] U.S. Cl. .................................. 330/257; 330/255; 330/265; 358/188
[58] Field of Search ............... 330/257, 263, 267, 288, 330/265, 255; 323/315, 316; 358/188

[56] References Cited

FOREIGN PATENT DOCUMENTS 657585 4/1979 U.S.S.R. .............................. 330/257

Primary Examiner—James B. Mullins
Assistant Examiner—G. Wan

[57] ABSTRACT

An integratable amplifier is disclosed for developing a high level output signal with reduced power dissipation. The amplifier includes a first circuit (108, 110) which responds to an input signal for developing first and second signal currents whose amplitudes increase and decrease, respectively, in response to an input signal transition of a given direction. A second circuit (32a) receives the first signal current for establishing a third signal current which mirrors the first signal current. The second and third signal currents are received by a third circuit (70a) for conversion thereof to an amplified output signal. To stabilize the gain of the amplifier, a negative feedback path (50a) is coupled between the input signal and the output signal.

12 Claims, 5 Drawing Figures

AMPLIFIER HAVING REDUCED POWER DISSIPATION AND IMPROVED SLEW RATE

This application is a continuation-in-part of copending U.S. application Ser. No. 232,783, filed Feb. 9, 1981, now abandoned.

TECHNICAL FIELD

This invention is directed generally to signal amplifiers, and particularly to large signal amplifiers capable of developing amplified signal outputs in excess of one hundred volts.

BACKGROUND ART

Amplifiers of the type used in television receivers and other products are frequently required to develop output signals in excess of one hundred volts. The three video output stages in a color television receiver are examples of this type of amplifier.

Typical video output stages are required to have a small signal bandwidth of from four to six megahertz and a slew rate of from 250 to 500 volts per microsecond. Conventional video output stages generally meet these requirements, but they do so using designs which dissipate considerable power. For example, three conventional video output stages in a television receiver may dissipate up to five watts.

The trend in modern television receivers is to construct as much of the circuitry as possible on integrated circuit chips. Because of the relatively high power dissipation of conventional video output stages, however, it has not been practical to integrate them. The present invention overcomes this problem by providing an amplifier which is capable of being integrated and which meets the conventional slew rate and bandwidth requirements.

OBJECTS OF THE INVENTION

It is a general object of the invention to provide an improved amplifier.

It is a more specific object of the invention to provide an intergratable amplifier having a relatively wide bandwidth, a good slew rate and having an output capability in excess of one hundred volts.

BRIEF DESCRIPTION OF THE DRAWINGS

The objects stated above and other objects of the invention are set forth more particularly in the following detailed description and accompanying drawings, of which.

DISCLOSURE OF INVENTION AND DESCRIPTION OF THE PREFERRED EMBODIMENT

Figure 1:
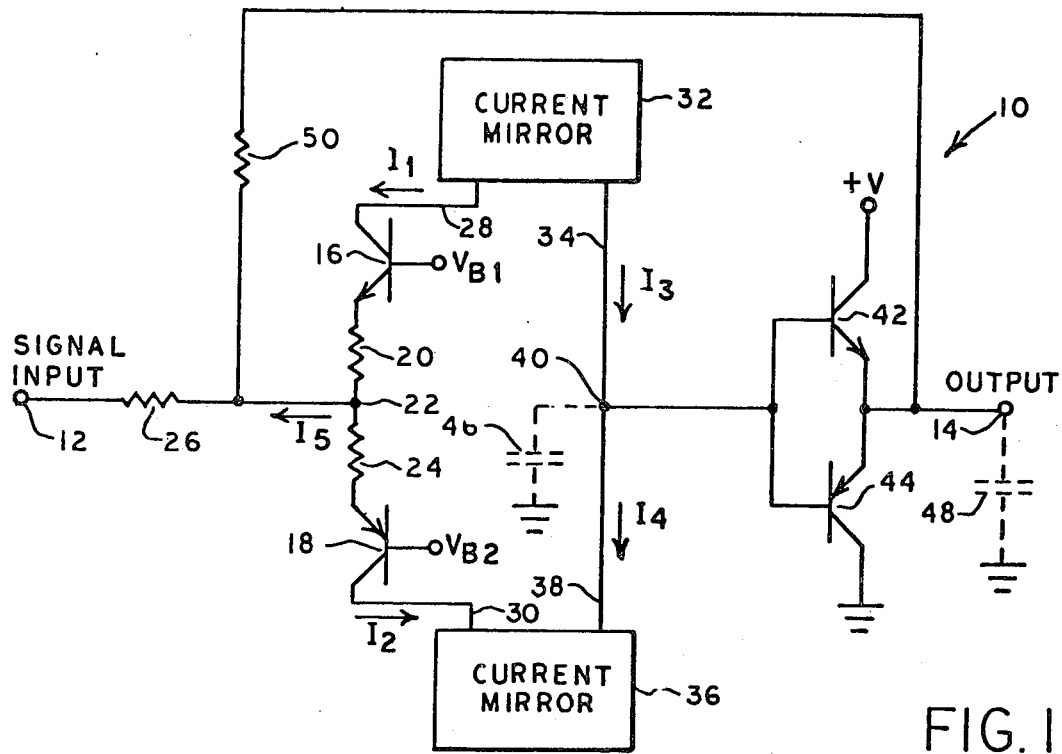
FIG. 1 shows an amplifier embodying various aspects of the invention.

Referring to FIG. 1, an integratable amplifier 10 is shown which embodies various aspects of the invention. This amplifier has an input 12 for receiving a signal input and an output 14 at which an amplified signal is developed.

Included in the illustrated amplifier is an input stage comprising an NPN transistor 16, a PNP transistor 18, a resistor 20 coupling the emitter of transistor 16 to a common node 22, and a resistor 24 coupling the emitter of transistor 18 to the node 22. This input stage receives the signal input at the node 22 via a resistance 26.

A bias voltage $VB_1$ is applied to the base of the transistor 16 and another bias voltage $VB_2$ is applied to the base of the transistor 18. These two bias voltages are selected to turn on the transistors 16 and 18 so that the transistor 16 conducts a small quiescent $I_1$ and the transistor 18 conducts a small quiescent current $I_2$ which equals $I_1$. Typically the currents $I_1$ and $I_2$ each equal about 50 microamperes.

Coupled to the collector of transistor 16 is a first input current path 28 through which the current $I_1$ flows. A second input current path 30 is coupled to the collector of transistor 18 for carrying the current $I_2$.

Receiving the current $I_1$ is a current mirror 32 which may be of conventional construction. The function of the current mirror 32 is to establish a current $I_3$ in an output current path 34 such that the current $I_3$ mirrors the current $I_1$. That is, the current $I_3$ is proportional to the current $I_1$. In the case where the mirror 32 includes gain, the current $I_3$ is larger in amplitude than the current $I_1$ but otherwise similar to it.

Another current mirror 36 receives the current $I_2$ for establishing a current $I_4$ in another output current path 38. The mirrors 32 and 36 exhibit equal gain, if any, so that the currents $I_3$ and $I_4$ are equal under quiescent conditions.

The current paths 34 and 38 are coupled to a common node 40. Also coupled to the node 40 is an output stage which includes transistors 42 and 44. The emitters of these transistors are both coupled to the output terminal 14 and their bases are both coupled to the node 40. This forms a class B output stage in which the transistors 42 and 44 draw little or no current in quiescent conditions.

The factors which influence the slew rate of the amplifier 10 are the parasitic capacitance 46 at the node 40 and the capacity 48 at the output terminal 14. The latter capacity may be, for example, the capacity of a cathode ray tube which is driven by the amplifier 10. The way in which good slew rate is achieved will be understood from the following description of operation.

In the quiescent conditions, the currents $I_1$ through $I_4$ are very small. Because the current $I_3$ is substantially equal to the current $I_4$, only small base currents, if any, flow in the transistors 42 and 44. Hence, very little power is dissipated when no signal input is present.

When the signal input at terminal 12 undergoes a rapid negative transition of two volts, for example, the conduction of transistor 16 may typically increase to about 500 microamperes. The transistor 18 turns off, and a current $I_5$ of about 500 microamperes flows toward the resistor 26 from the node 22.

The current mirror 32 establishes a larger current $I_3$ in the current path 34 for rapidly charging the capacitance 46. The transistor 42 responds to the increasing voltage at node 40 by turning on and rapidly charging the capacitance 48, thereby driving the output voltage high.

When the input signal undergoes a rapid positive transition, the transistor 16 turns off and the transistor 18 conducts harder to increase $I_2$. The current $I_4$ undergoes a proportional increase due to the operation of the current mirror 36. Consequently, the current $I_4$ rapidly discharges the capacitance 46 and the voltage at node 40 decreases. In addition, the transistor 44 is turned on for rapidly discharging the capacitance 48 and driving the output voltage low. In this manner, the capacitances 46 and 48 are rapidly charged and discharged to achieve a good slew rate.

The comments above describe the amplifier 10 in terms of its open loop operation, i.e., without feedback. In that condition the open loop gain of the amplifier can be shown to equal 2 times $R_{out} \div R$, where $R_{out}$ equals the output impedance of the current mirrors and R is the value of the resistors 20 and 24. Because $R_{out}$ is typically several hundred thousand ohms and the value of the resistors 20 and 24 is typically a few thousand ohms or less, the open loop gain of the amplifier is quite large. Because it is an inverting amplifier, a feedback path may be included to couple the output signal back to the input stage to stabilize amplifier operation. In the illustrated embodiment, a feedback resistor 50 is coupled between the output terminal 14 and the node 22. With the feedback resistor in circuit, the magnitude of the gain of the amplifier is approximately equal to the ratio of the resistor 50 to the resistor 26. Now the input stage responds to the instantaneous difference between the output signal and the input signal for increasing the current in one of the input current paths and decreasing the current in the other input current path so that the currents in the output current paths increase and decrease correspondingly, and the output stage varies the amplitude of the output signal as a function of the difference between the currents in the output current paths.

The primary advantages of this arrangement is that the amplifier 10 is integratable and yet consumes relatively little power. At quiescence, the currents $I_1$, $I_2$, $I_3$ and $I_4$ are very small. Those currents increase only when the input signal undergoes a large, rapid transition. In other words, the currents $I_1$ through $I_4$ increase only as needed to charge or discharge the capacitances 46 and 48.

When the amplifier 10 is integrated, the transistor 44 may be constructed as a lateral PNP. Because such transistors normally have a relatively low current gain and a relatively poor frequency response, the use of a lateral PNP in the output stage renders the amplifier 10 more suited to audio frequency applications rather than video frequency applications.

Figure 2:
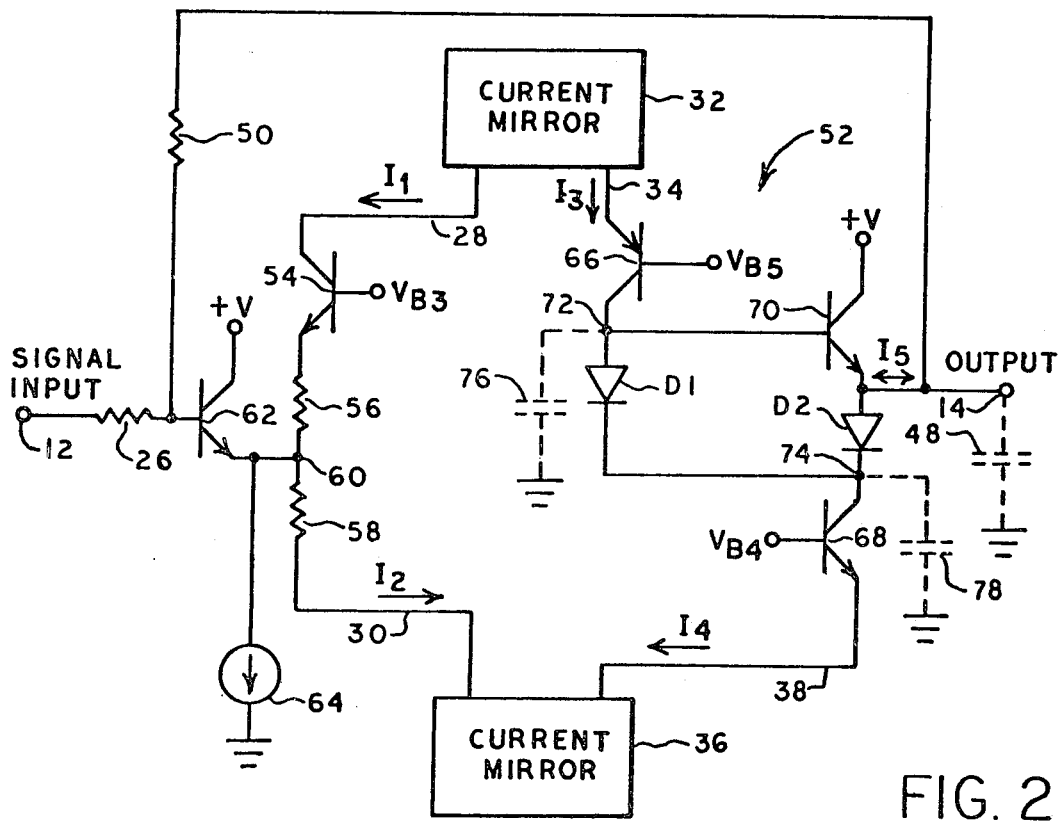
FIG. 2 shows an amplifier which is similar to the amplifier of FIG. 1 but which is specifically designed as a video amplifier.

Referring now to FIG. 2, another amplifier 52 is shown which is a modified version of the amplifier 10 for use as a video output stage. Components of the amplifier 52 which provide functions similar to corresponding components of the amplifier 10 have corresponding reference numerals.

The amplifier 52 includes the first and second input current paths 28 and 30, and first and second output current paths 34 and 38. Current mirrors 32 and 36, each having a current gain of about ten, couple each input current path to an output current path in the manner described previously.

One modification incorporated in the amplifier 52 is the elimination of a PNP transistor in the input stage. That stage now includes a single NPN transistor 54, and a pair of matched resistors 56 and 58 coupled to a common node 60. A bias voltage $VB_3$ is applied to the base of the transistor 54 to establish small quiescent currents $I_1$ and $I_2$ in the input current paths. Currents $I_3$ and $I_4$ flow in the output current paths 34 and 38.

To increase the amplifiers's current gain and its input impedance, the input signal is coupled to the node 60 by an emitter follower transistor 62. A current source 64 is coupled to the emitter of the transistor 62 and establishes the upper limit of the current which the transistor 54 can conduct in response to a negative voltage transition at the signal input terminal 12.

Another modification included in the amplifier 52 is the inclusion of a PNP transistor 66 in the current path 34 and an NPN transistor 68 in the current path 38. These transistors are included to increase the amplifier's bandwidth and slew rate.

Typically, each of the current mirrors 32 and 36 includes an output transistor whose collector to base capacity is increased by virtue of the so-called Miller effect. By coupling the transistors 66 and 68 in the output current paths as shown, and by applying fixed bias voltages $VB_4$ and $VB_5$ to their bases, the Miller effect is reduced and the amplifier's bandwidth and slew rate are increased.

The output stage of the amplifier 52 is modified to eliminate the lateral PNP transistor. Instead, an NPN transistor 70 has a base coupled to a node 72 and an emitter coupled to the output terminal 14. A diode D1 is coupled between the node 72 and the current path 38 at node 74, and another diode D2 is coupled between the output terminal 14 and the node 74.

The operation of the amplifier 52 is similar to the operation of the amplifier 10 in that, at quiescence, small currents $I_1$ through $I_4$ flow in their respective current paths. When a negative voltage transition occurs at the input terminal 12, the currents $I_1$ and $I_3$ increase, and the currents $I_2$ and $I_4$ decrease. The transistor 66 conducts the current $I_3$ to the node 72 for rapidly charging parasitic capacitance 76. The diode D1 remains continuously on and conducts charging current to parasitic capacitance 78 at the node 74. In addition, the diode D2 is off and the transistor 70 conducts an output current $I_5$ for charging the output capacitance 48 and increasing the output voltage.

When a siganl input transition of the opposite polarity occurs, the transistor 70 turns off, the diode D1 remains on, and the diode D2 turns on. The transistor 68 carries a current $I_4$ for discharging capacitances 76 and 78, and an output current $I_5$ flows from the terminal 14, through diode D2, and to the transistor 68 for discharging the capacitance 48 and decreasing the output voltage.

The feedback resistor 50 causes the input stage to respond to the instantaneous difference between the output signal and the input signal for increasing the current in one of the output paths, and the output stage varies the amplitude of the output signal as a function of the difference between the currents in the output current paths.

Figure 3:
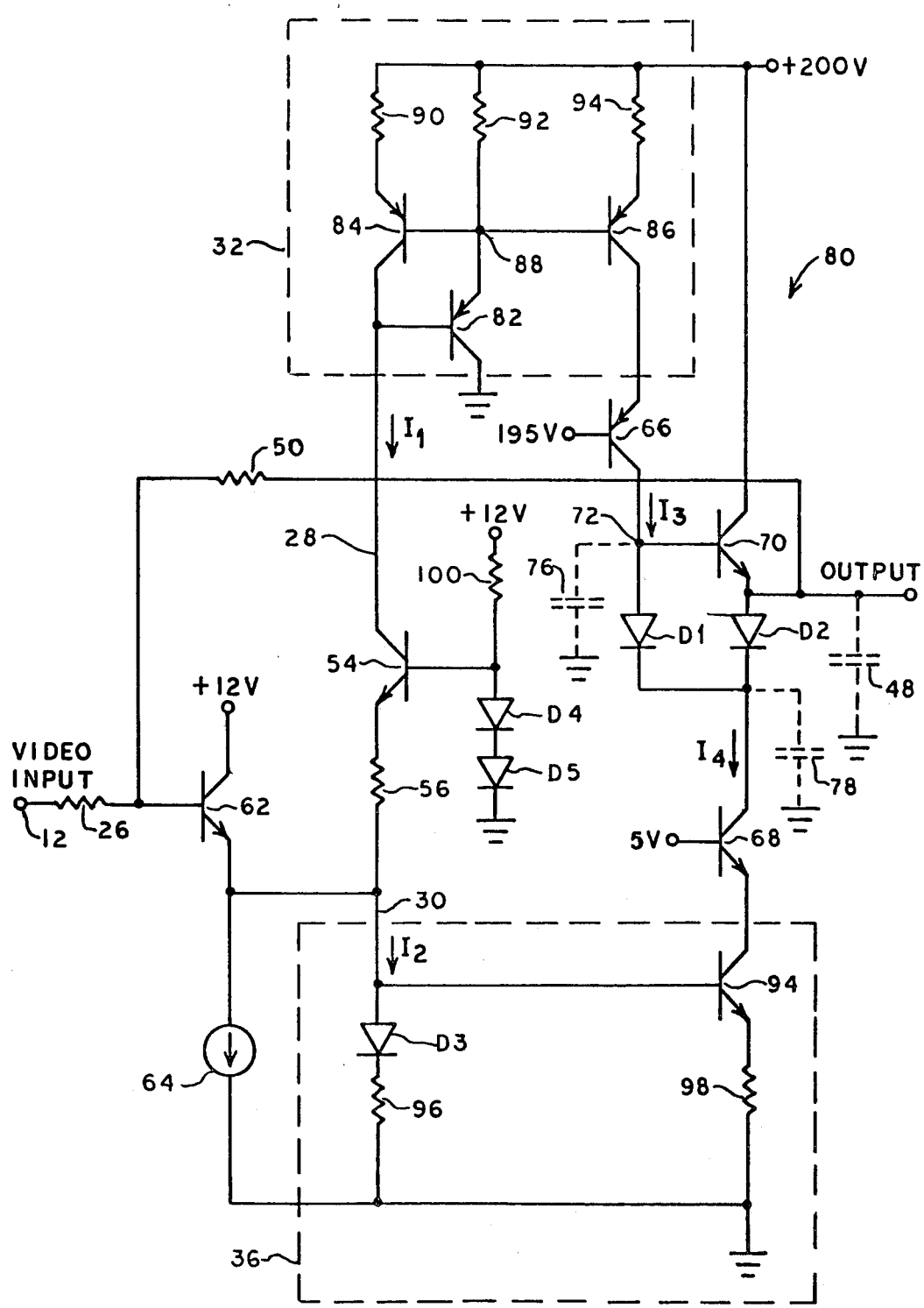
FIG. 3 shows another amplifier which is similar to the amplifier of FIG. 2, and which includes additional circuit details which are not shown in FIG. 2.

Referring now to FIG. 3, an amplifier 80 is shown which is similar to the amplifier 52 and which is designed as a video amplifier for developing the output signal whose amplitude can vary between 5 volts and about 195 volts. The preferred construction of the current mirrors 32 and 36 is also shown.

The current mirror 32 is a PNP current mirror having PNP transistors 82, 84 and 86. The collector of the transistor 84 and the base of the transistor 82 are coupled to the input path 28. The emitter of transistor 82 and the bases of transistors 84 and 86 are coupled together at a node 88.

The emitter of transistor 84 is coupled to a 200 volts source via a resistor 90. Another resistor 92 couples the node 88 to the 200 volt source. The emitter of the transistor 86 is coupled to the same voltage source by a resistor 94. With this arrangement, the collector of transistor 86 delivers the current $I_3$ to the transistor 66. The base of the latter transistor is biased by a 195 volt source.

The mirror 36 is a NPN current mirror which includes a diode D3, a transistor 94 and resistors 96 and 98. The anode of the diode D3 is coupled to the current path 30, and its cathode is coupled to ground via the resistor 96. The emitter of the transistor 94 is coupled to ground through the resistor 98. The collector of the transistor 94 is coupled to the emitter of transistor 68 whose base receives a 5 volt bias.

The gain of the current mirror 36 depends primarily on the ratio of the resistor 98 to the resistor 96. Preferably, the resistor 98 is selected to be ten times smaller than the resistor 96 to achieve a current gain of approximately 10. A current gain of approximately 10 is established in the current mirror 32 by selecting the resistor 94 to be ten times smaller than the resistor 90.

Referring to the transistor 54, it may be biased by the illustrated connection of a resistor 100 and diodes D4 and D5. The value of the resistor 100 may be selected to develop about one milliampere of current in the diodes D4 and D5.

The current source 64 at the emitter of transistor 62 may be conventional and may be selected to provide a current of about one milliampere.

The amplifier 80 operates as previously described for the amplifier 52. The only difference in construction is that the resistor 58 (FIG. 2) is eliminated from the input current path 30 to provide increased current drive for the transistor 94. The resistor 56 may be selected to provide about 50 d.b. of open loop amplifier gain.

The illustrated construction has been found to provide an amplifier slew rate of about one volt per nanosecond, a bandwith of about 6 to 8 megahertz, and an output signal swing of from about 5 volts to 195 volts. Hence, it is well suited for use as a video output stage in a television receiver.

The embodiments described previously have certain common constructional features. For example, they include first and second input current paths, first and second output current paths, and an output stage. Another way of characterizing some of the common features of the embodiments described above is that each includes: a circuit for generating a first signal current ($I_1$ in FIGS. 1, 2 and 3, for example) whose amplitude increases in response to input signal transitions of a given direction, and a second signal current ($I_2$ in FIGS. 1, 2 and 3, for example) whose amplitude decreases in response to the same input signal transitions; another circuit (such as current mirror 32) for establishing a third signal current ($I_3$, for example) which mirrors the first signal current; a further circuit (current mirror 36 and the output stage) which receives the second and third currents for conversion thereof to an amplified output signal; and a negative feedback path for stabilizing the gain of the amplifier. Considering the invention from this standpoint, it can be seen that a second current mirror (such as current mirror 36) and a fourth output current are not absolutely required. An embodiment of the invention which replaces the current mirror 36 with a different form of circuitry is shown in FIG. 4 in which components which provide functions similar to components in the previous figures have corresponding reference numerals followed by the character "a".

Figure 4:
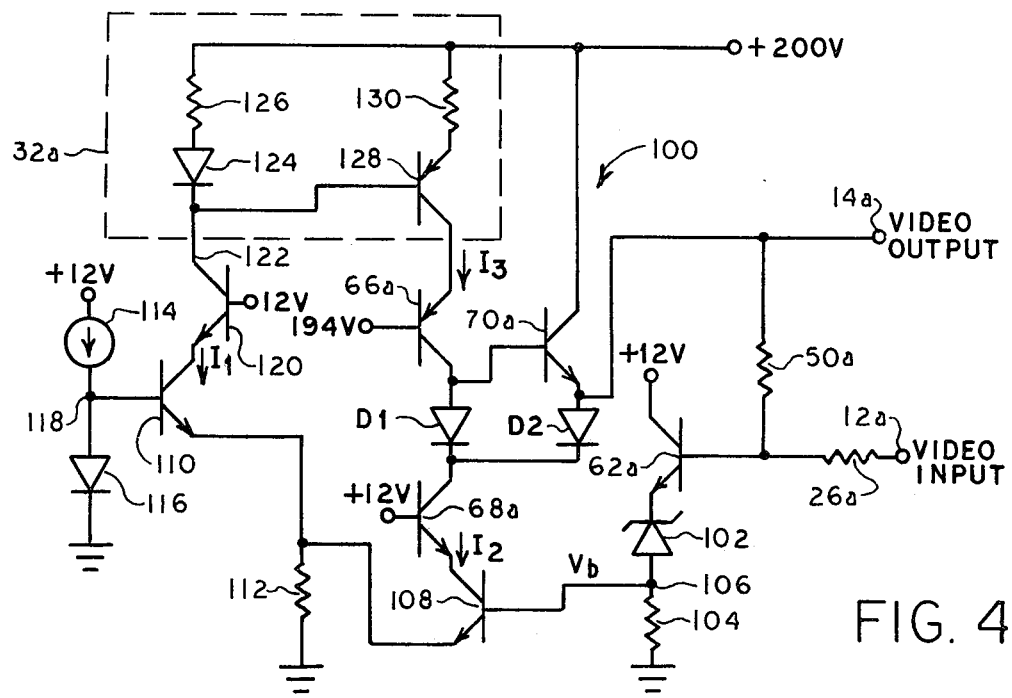
FIG. 4 illustrates another embodiment of an amplifier which is specifically designed as a video amplifier according to the invention.

Turning now to FIG. 4, an amplifier 100 is shown which is specifically designed as an integratable video amplifier for use in a television receiver. The illustrated amplifier receives a video input signal at an input terminal 12a for developing an amplified video output signal at a terminal 14a. A feedback resistor 50a is coupled between the input signal and the output terminal 14a to stabilize the gain of this amplifier.

As described in more detail below, the amplifier 100 includes circuitry which responds to the input video signal for generating a first signal current $I_1$ whose amplitude increases in response to input signal transitions of a given direction or polarity, and a second signal current $I_2$ whose amplitude decreases in response to the same input signal transitions. Further circuitry in the form of a current mirror 32a receives the current $I_1$ for establishing a third signal current $I_3$ which is proportional to the current $I_1$. An output stage which includes a transistor 70a converts the currents $I_2$ and $I_3$ to an amplified output signal at the terminal 14a.

More specifically, the input signal at terminal 12a is coupled to an input transistor 62a via a resistance 26a. The emitter of this transistor is coupled to ground through a zener diode 102 and a resistor 104. In the case where the input signal is superimposed on a D.C. voltage of about 8.5 volts, the zener diode may be selected to provide a D.C. voltage of about 0.85 volt at the junction (node 106) between itself and the resistor 104.

The node 106 is coupled to the base of a transistor 108 whose emitter is coupled to the emitter of another transistor 110, with a resistor 112 coupling both emitters to ground. Thus, the transistors 108 and 110 comprise a differential amplifier.

To establish a selected quiescent current in the transistor 110, a conventional D.C. current source 114 is coupled to a grounded diode 116 at node 118, and this node is connected to the base of the transistor 110. With this arrangement, the transistor 110, the source 114 and the diode 116 collectively form a current mirror such that the quiescent current conducted by transistor 110 is substantially equal to the current provided by the source 114. Typically, the D.C. quiescent current conducted by the transistor 110 is about 350 microamperes.

The collector circuit of the transistor 110 is coupled to the emitter of a signal coupling transistor 120. The base of this latter transistor receives a D.C. bias voltage (12 volts, for example) and its collector is coupled via a lead 122 to the input of the current mirror 32a.

As shown, the current mirror 32a includes a diode 124 serially coupled with a resistor 126 between a supply voltage (200 volts, for example) and the lead 122. The cathode of the diode 124 is coupled to the base of a PNP transistor 128 whose emitter is coupled through another resistor 130 to the supply voltage. A current mirror is thus provided which provides an output current $I_3$ which is proportional to the current $I_1$; that is, $I_3 = KI_1$, where K is a constant factor which is greater than 1 and typically about 15. This factor K is primarily determined by selecting the resistor 126 to be K times larger than the resistor 130.

The current output $I_3$ from the mirror 32a is coupled to the emitter of a signal coupling transistor 66a whose base receives a D.C. bias voltage of 194 volts, for example. The collector of this transistor is coupled to the base of the transistor 70a and to the anode of a diode D1. The emitter of the transistor 70a is coupled at the output terminal 14a and to the anode of another diode D2. The cathodes of both diodes are coupled together as shown.

Referring now to the transistor 108, its collector circuit is coupled to the emitter of another signal coupling transistor 68a whose base receives a D.C. bias voltage of 12 volts, for example. The collector of the transistor 68a is coupled to the cathodes of diodes D1 and D2.

Under quiescent conditions (no A.C. input signal), the currents $I_2$ and $I_3$ are substantially equal to each other and substantially equal to $KI_1$. This condition is established, in part, by the feedback resistor 50a forcing the differential base voltage between transistors 108 and 110 to a level which causes $I_2$ to equal $KI_1$ at equilibrium. Under quiescent conditions, therefore, the current $I_1$ may be at a level of about 350 microamperes while the currents $I_2$ and $I_3$ are each at a level of about 5.25 milliamperes. The transistor 70a conducts very little, if any, current under these conditions.

Figure 5:
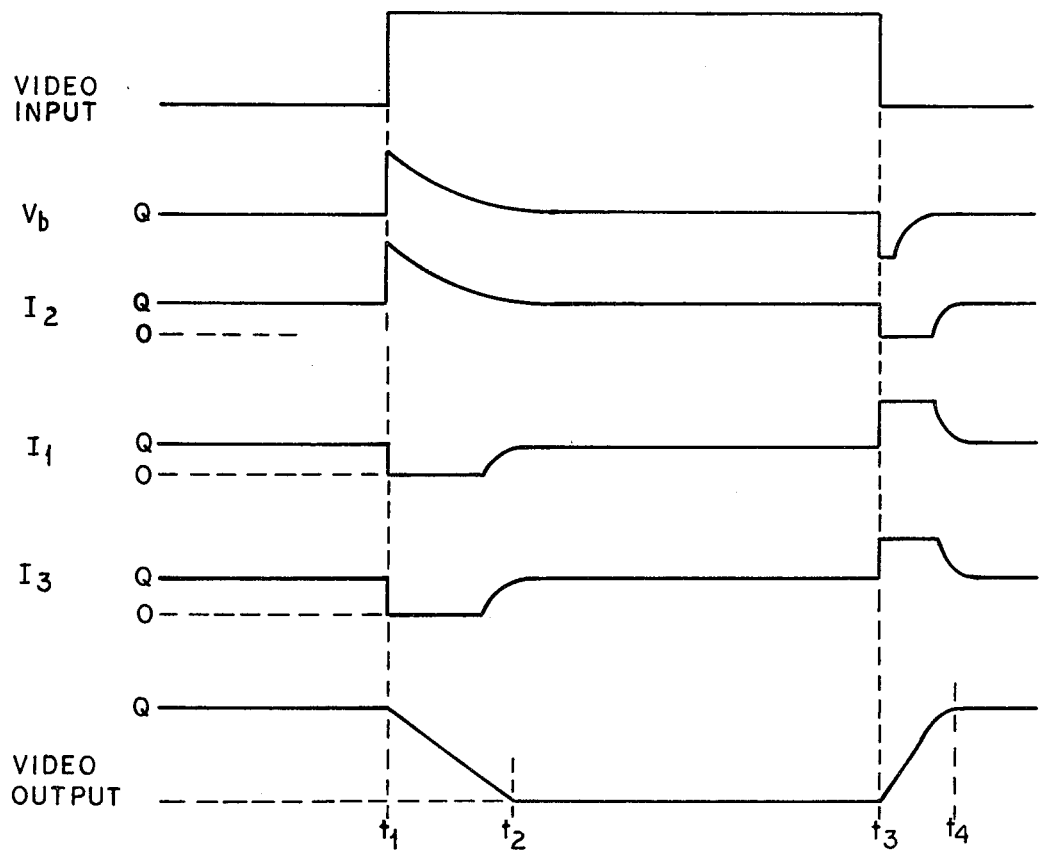
FIG. 5 illustrates various waveforms useful in describing the operation of the amplifier shown in FIG. 4.

The A.C. operation of the amplifier 100 will now be described with reference to the waveforms shown in FIG. 5 in which the waveform $V_b$ corresponds to the voltage on the base of the transistor 108, and in which the signal levels designated as "Q" correspond to quiescent conditions.

When the video input signal undergoes a positive transition at time $t_1$, the voltage $V_b$ undergoes a similar positive transition. Consequently, the conduction of transistor 108 increases to develop a rapid increase in the current $I_2$. Simultaneously, the conduction of the transistor 110 decreases to develop a rapid negative transition in the current $I_1$. If the magnitude of the positive transition in the video input signal is of sufficient magnitude, the current $I_2$ decreases to zero as indicated in FIG. 5.

In response to the decrease in the current $I_1$, the current mirror 32a rapidly reduces the current $I_3$ to zero and discharges any parasitic capacitance at the base of the transistor 70a. Accordingly, the current $I_2$ flows from the output terminal 14a, through the diode D2 and the transistor 68a, to the collector of the transistor 108. Any parasitic capacitance present at the terminal 14a is rapidly discharged so that the video output signal undergoes a relatively fast negative transition.

Because of the feedback resistor 50a, the voltage $V_b$ and the current $I_2$ decay to their quiescent values as the video output signal decreases toward its maximum negative value at time $t_2$. Consequently, the currents $I_1$ and $I_3$ increase to their quiescent values at the same time. While the video input signal remains at its maximum positive value (between times $t_2$ and $t_3$) the currents $I_1$, $I_2$ and $I_3$ remain at their quiescent levels.

When the video input signal undergoes a negative transition at time $t_3$, the voltage $V_b$ and the currents $I_2$ undergo rapid negative transitions while the current $I_1$ undergoes a rapid positive transition. Since the current $I_1$ has a maximum value which is limited by the value of the current supplied by the source 114, the currents $I_1$ and $I_3$ remain at a relatively constant level while charging the parasitic capacitance at the base of transistor 70a. The transistor 70a conducts a current similar to $I_3$ for driving the output signal high and charging parasitic capacitance at the output terminal 14a.

As the output signal returns to its quiescent value at time $t_4$, the currents $I_1$, $I_2$ and $I_3$ return to their quiescent values. Thus, the power dissipation of the amplifier is limited by increasing the currents $I_2$ and $I_3$ only as needed to charge the parasitic capacitances.

In a typical application, the current $I_2$ may increase to a maximum level of about 15 to 20 milliamperes, as determined by the value of the resistor 112. The current $I_3$ may increase to a maximum level of about 5.25 milliamperes due to the limited current supplied by the current source 114. Under these constraints, the rise time of the video output signal is typically about 200 nanoseconds, whereas its fall time is typically about 100 nanoseconds. Such a difference is ordinarily not objectionable. However, the rise time of the output signal may be made comparable to its fall time by, for example, increasing the level of current supplied by the source 102 or by otherwise increasing the current which the transistor 110 may conduct.

The amplifier 100 and the amplifier 80 (FIG. 3) dissipate substantially the same low level of power and provide output signals having comparable rise and fall times. An advantage of the amplifier 100, however, is that it requires no internal filters to operate rapidly. The amplifier 80, on the other hand, will operate best when the base of the transistor 54 is at a very low A.C. impedance as established, for example, by a filter capacitor (not shown) at the base of the transistor 54. Because the amplifier 100 does not require such a filter capacitor, it is preferred when construction is to be in integrated circuit form.

A characteristic of each of the illustrated embodiments is that they exhibit reduced power dissipation. This is primarily because their signal currents increase only "as needed" to respond to large amplitude transitions in the input signal. Consequently, the amplifiers are much more easily integrated than conventional large signal amplifiers.

Although the invention has been described in terms of the illustrated embodiments, it will be obvious to those skilled in the art that many alterations and modifications may be made without departing from the invention. Accordingly, it is intended that all such alterations and modifications be included within the spirit and scope of the invention as defined by the appended claims.

What is claimed is:

1. An amplifier comprising:
    first circuit means receiving an input signal for generating a first signal current whose amplitude increases in response to input signal transitions of a given direction, and for generating a second signal current whose amplitude decreases in response to the same input signal transitions;
    second circuit means comprising a first current mirror having an input and an output, wherein the input of the first current mirror receives the first signal current for establishing a third signal current in the output thereof which mirrors the first signal current;
    a second current mirror receiving the second signal current for generating a fourth signal current which mirrors the second signal current;
    an output stage receiving the third and fourth signal currents for developing an output signal corresponding to the difference between the third and fourth signal currents; and a negative feedback path coupled between the input signal and the output signal to stabilize the gain of the amplifier;

said first circuit means comprising a first transistor having its collector coupled to the input of the first current mirror and its base coupled to a bias voltage, a first resistor coupled between a common node and the emitter of the first transistor, a second transistor having its collector coupled to an input of the second current mirror and its base coupled to a bias voltage, a second resistor coupled between the common node and the emitter of the second transistor and means for coupling the input signal to said common node.

2. An amplifier as set forth in claim 1 wherein said feedback path includes an impedance coupling the output signal to said common node.

3. An amplifier, comprising:

first circuit means receiving an input signal for generating a first signal current whose amplitude increases in response to input signal transitions of a given direction, and for generating a second signal current whose amplitude decreases in response to the same input signal transitions;

second circuit means comprising a first current mirror having an input and an output, wherein the input of the first current mirror receives the first signal current for establishing a third signal current in the output thereof which mirrors the first signal current;

a second current mirror receiving the second signal current for generating a fourth signal current which mirrors the second signal current;

an output stage receiving the third and fourth signal currents for developing an output signal corresponding to the difference between the third and fourth signal currents; and a negative feedback path coupled between the input signal and the output signal to stabilize the gain of the amplifier;

said first circuit means comprising a transistor whose collector is coupled to the input of the first current mirror and whose base receives a bias voltage, a first resistance coupled between a common node and the emitter of said transistor, a second resistance coupling the common node to the input of the second current mirror and means for coupling the input signal to said common node.

4. An amplifier as set forth in claim 3 wherein said means for coupling the input signal to the common node includes an emitter follower transistor whose base receives the input signal and whose emitter is coupled to said common node.

5. An amplifier as set forth in claim 4 wherein said feedback includes an impedance coupling the output signal to the base of the emitter follower transistor.

6. An amplifier, comprising:

first circuit means receiving an input signal for generating a first signal current whose amplitude increases in response to input signal transitions of a given direction, and for generating a second signal current whose amplitude decreases in response to the same input signal transitions;

second circuit means comprising a first circuit mirror having an input and an output, wherein the input of the second current mirror receives the first signal current for establishing a third signal current in the output thereof which mirrors the first signal current;

a second current mirror receiving the second signal current generating a fourth signal current which mirrors the second signal current;

an output stage receiving the third and fourth signal currents for developing an output signal corresponding to the difference between the third and fourth signal currents, wherein the third signal current is coupled to the output stage by a first signal coupling transistor having an emitter coupled to the output of the first current mirror, having a base receiving a bias voltage, and having a collector coupled to the output stage, and wherein the fourth current signal is coupled to the output stage by a second signal coupling transistor having an emitter coupled to the output of the second current mirror, having a base receiving a bias voltage, and having a collector coupled to the output stage; and a negative feedback path coupled between the input signal and the output signal to stabilize the gain of the amplifier.

7. An amplifier as set forth in claim 6 wherein the output stage includes:

an output transistor having its base coupled to the collector of the first signal coupling transistor, having the collector coupled to a source of operating voltage and its emitter coupled to an output terminal;

a first diode coupled between the base of the output transistor and the collector of the second signal coupling transistor; and a second diode coupled between the emitter of the output transistor and the collector of the second signal coupling transistor.

8. A video amplifier for a television receiver, comprising:

means defining first and second input current paths;

an input stage for establishing currents in the first and second input current paths, the input stage, including:

a first transistor receiving a bias voltage at its base and having its collector coupled to the first input current path;

a resistance coupling the emitter of the first transistor to a common node and to the second input current path; and means coupling an input video signal to the common node for establishing signal currents in the first and second current paths;

a first current mirror having an input receiving current from the first current path and having an output;

a second current mirror having an input receiving current from the second current path and having an output;

a first output current path, including a PNP transistor having a base, an emitter and a collector, the base of the PNP transistor receiving a bias voltage and its emitter being coupled to the output of the first current mirror;

a second output current path, including an NPN transistor having a base, an emitter and a collector, the base of the NPN transistor receiving a bias voltage and its emitter being coupled to the output of the second current mirror;

an output stage coupled to the collectors of the NPN and PNP transistors for developing an amplified video output signal; and a feedback impedance coupling the video output signal back to said means which couples the input video signal to the common terminal.

9. A video amplifier for a television receiver comprising:

a differential amplifier comprising first and second emitter coupled transistors, said first transistor having a base coupled to first means including a current source for forming therewith a first current mirror in which the current conducted by said first transistor comprises a first signal current which mirrors the current generated by said current source under quiescent conditions, said second transistor having a base coupled for receiving an input video signal and a collector circuit developing a second signal current;

a second current mirror coupled to said differential amplifier and receiving said first current signal for generating a third current signal which is proportional to the first current signal;

an output stage including a buffer transistor coupled to the output of said second current mirror and coupled to the collector circuit of the second transistor of said differential amplifier for providing an amplified output signal, whereby, under quiescent conditions, the second and third signal currents are characterized by relatively small substantially equal values to minimize power dissipation and under conditions of large input signal transitions the output stage buffer transistor is either on for establishing a signal path for rapidly charging the output signal or is off for facilitating the rapid discharge of the output signal via the second signal current for effecting a high slew rate; and a negative feedback path coupled between the input video signal and the output signal to stabilize the gain of the amplifier.

10. A video amplifier as set forth in claim 9 wherein said first means comprises a diode connected in series with said current source and wherein the base of said first transistor is connected to the common junction of said diode and said current source.

11. A video amplifier as set forth in claim 10 including a common resistor coupling the emitters of said first and second transistors to ground potential.

12. A video amplifier as set forth in claim 11 wherein the buffer transistor includes a base coupled to the output of said second current mirror, a collector coupled to a source of supply potential and an emitter coupled to an output terminal, and further including a diode coupling the emitter of the buffer transistor to the collector circuit of said second transistor.

* * * * *